United States Patent
Curatola et al.

(10) Patent No.: US 9,373,688 B2
(45) Date of Patent: Jun. 21, 2016

(54) NORMALLY-OFF HIGH ELECTRON MOBILITY TRANSISTORS

(75) Inventors: Gilberto Curatola, Villach (AT); Oliver Häberlen, Villach (AT); Gianmauro Pozzovivo, Villach (AT)

(73) Assignee: Infineon Technologies Austria AG, Villach (AT)

(*) Notice: Subject to any disclaimer, the term of this patent is extended or adjusted under 35 U.S.C. 154(b) by 849 days.

(21) Appl. No.: 13/100,343

(22) Filed: May 4, 2011

(65) Prior Publication Data
US 2012/0280278 A1  Nov. 8, 2012

(51) Int. Cl.
| | |
|---|---|
| *H01L 29/778* | (2006.01) |
| *H01L 29/66* | (2006.01) |
| *H01L 29/423* | (2006.01) |
| *H01L 29/43* | (2006.01) |
| *H01L 29/20* | (2006.01) |

(52) U.S. Cl.
CPC .... *H01L 29/42356* (2013.01); *H01L 29/42316* (2013.01); *H01L 29/432* (2013.01); *H01L 29/66462* (2013.01); *H01L 29/7786* (2013.01); *H01L 29/2003* (2013.01)

(58) Field of Classification Search
USPC ........................................................ 257/191
See application file for complete search history.

(56) References Cited

U.S. PATENT DOCUMENTS

| | | | |
|---|---|---|---|
| 7,038,252 B2 | 5/2006 | Saito | |
| 2005/0077541 A1* | 4/2005 | Shen et al. | 257/194 |
| 2005/0087765 A1* | 4/2005 | Saito et al. | 257/192 |
| 2006/0019435 A1* | 1/2006 | Sheppard et al. | 438/167 |
| 2007/0158692 A1* | 7/2007 | Nakayama et al. | 257/213 |

FOREIGN PATENT DOCUMENTS

| | | |
|---|---|---|
| CN | 1989601 A | 6/2007 |
| JP | 2001230407 A | 8/2001 |
| JP | 2010232610 A | 10/2010 |

OTHER PUBLICATIONS

Asgari et al., "The effects of GaN capping layer thickness on two-dimensional electron mobility in GaN/AlGaN/GaN heterostructures", Physica E 25 (2005) 431-437, Oct. 2004, Elsevier B.V.*

Uemoto, Yasuhiro, "Gate Injection Transistor (GIT)—A Normally-Off AlGaN/GaN Power Transistor Using Conductivity Modulation", IEEE Transactions on Electron Devices, vol. 54, No. 12, Dec. 2007.

* cited by examiner

*Primary Examiner* — Andy Huynh
*Assistant Examiner* — Sitaramarao S Yechuri
(74) *Attorney, Agent, or Firm* — Murphy, Bilak & Homiller, PLLC (57) ABSTRACT

A normally-off transistor includes a first region of III-V semiconductor material, a second region of III-V semiconductor material on the first region, a third region of III-V semiconductor material on the second region and a gate electrode adjacent at least one sidewall of the third region. The first region provides a channel of the transistor. The second region has a band gap greater than the band gap of the first region and causes a 2-D electron gas (2DEG) in the channel. The second region is interposed between the first region and the third region. The third region provides a gate of the transistor and has a thickness sufficient to deplete the 2DEG in the channel so that the transistor has a positive threshold voltage.

26 Claims, 8 Drawing Sheets

NORMALLY-OFF HIGH ELECTRON MOBILITY TRANSISTORS

FIELD OF TECHNOLOGY

The present application relates to normally-off high electron mobility transistors, in particular normally-off high electron mobility transistors without p-type doping in the gate region.

BACKGROUND

Conventional high electron mobility transistors (HEMTs), also referred to as heterostructure FETs (HFETs) or modulation-doped FETs (MODFETs), are typically fabricated in GaN technology and generally characterized by a negative threshold voltage. That is, a current flows between source and drain terminals of the device even without applying any voltage to the gate electrode to open the transistor. Indeed, in GaN technology, a thin channel (inversion layer) is automatically created via strain and polarization effects between the source and drain terminals without the application of any voltage to the gate electrode. As such, the device is commonly referred to as being normally-on.

The normally-on feature of HEMTs is an intrinsic property of GaN technology, and restricts the range of applications for GaN technology to those applications where a power supply is available to generate the negative voltages necessary to turn off the GaN device. Moreover, the normally-on feature complicates the design of the circuitry needed to drive GaN transistors.

Attempts have been made to fabricate normally-off GaN HEMTs, i.e. GaN transistors with a positive threshold voltage. For example, a thin layer (20-50 nm) of p-type doped GaN material can be formed under the gate electrode. This thin p-type GaN layer depletes the inversion layer under the gate electrode, shifting the threshold voltage to positive values. The thin p-type GaN layer creates a vertical field which depletes and populates the naturally occurring inversion channel underlying the barrier layer, typically a layer of AlGaN. In addition, the vertical field generated by a voltage applied to the gate electrode allows to modulate on and off the inversion layer.

However, unlike conventional silicon technology, doping of a large bandgap material such as GaN is not trivial. Indeed, the fabrication of a thin p-type doped GaN layer requires very complicated processing. Moreover, threshold voltage instability can arise due to the non-uniform doping of the GaN layer and, in particular due to surface accumulation of p-type dopant elements at the exposed GaN surface. In addition, the maximum gate voltage which can be tolerated by the device is limited by the presence of a p-n junction under the gate electrode. Once the built-in voltage of the p-n junction is reached, a large and possibly detrimental gate leakage flows directly from the gate contact toward the source and drain electrodes. Using a p-type doped GaN layer under the gate electrode also limits the transconductance of the device because the gate electrode is spaced further away from the inversion channel by a distance corresponding to the thickness of the p-type GaN layer. The p-type doped GaN layer does yield a low threshold voltage of about 1V. In principle, the threshold voltage can be increased by increasing the thickness of the p-type GaN layer. However, the transconductance of the device degrades as a function of the p-type GaN layer thickness and the device becomes unusable if the thickness of this layer becomes too large.

SUMMARY

According to an embodiment of a normally-off transistor, the transistor includes a first region of III-V semiconductor material, a second region of III-V semiconductor material on the first region, a third region of III-V semiconductor material on the second region and a gate electrode adjacent at least one sidewall of the third region. The first region provides a channel of the transistor. The second region is interposed between the first region and the third region and has a band gap greater than the band gap of the first region. The second region also causes a 2-D electron gas (2DEG) in the channel. The third region provides a gate of the transistor and has a thickness sufficient to deplete the 2DEG in the channel so that the transistor has a positive threshold voltage.

According to another embodiment of a normally-off transistor, the transistor includes a buffer region of III-V semiconductor material, a barrier region of III-V semiconductor material on the buffer region, a gate region of III-V semiconductor material on the barrier region so that the barrier region is interposed between the buffer region and the gate region, and a gate electrode adjacent the gate region. The barrier region has a band gap greater than the band gap of the buffer region. The gate region is undoped or n-doped and thick enough to deplete a 2-D electron gas in the buffer region so that the transistor has a positive threshold voltage.

According to yet another embodiment of a normally-off transistor, the transistor includes a first GaN layer, an AlGaN layer on the first GaN layer, a second GaN layer on the AlGaN layer so that the AlGaN layer is interposed between the first and second GaN layers, and a gate electrode adjacent the second GaN layer. The second GaN layer is undoped or n-doped and at least 150 nm thick.

According to an embodiment of a method of manufacturing a normally-off transistor, the method includes forming a first region of III-V semiconductor material and forming a second region of III-V semiconductor material on the first region, the second region having a band gap greater than the band gap of the first region. The method further includes forming a third region of III-V semiconductor material on the second region so that the second region interposed between the first region and the third region, the third region having a thickness sufficient to deplete a 2-D electron gas (2DEG) in the channel so that the transistor has a positive threshold voltage, and forming a gate electrode adjacent at least one sidewall of the third region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
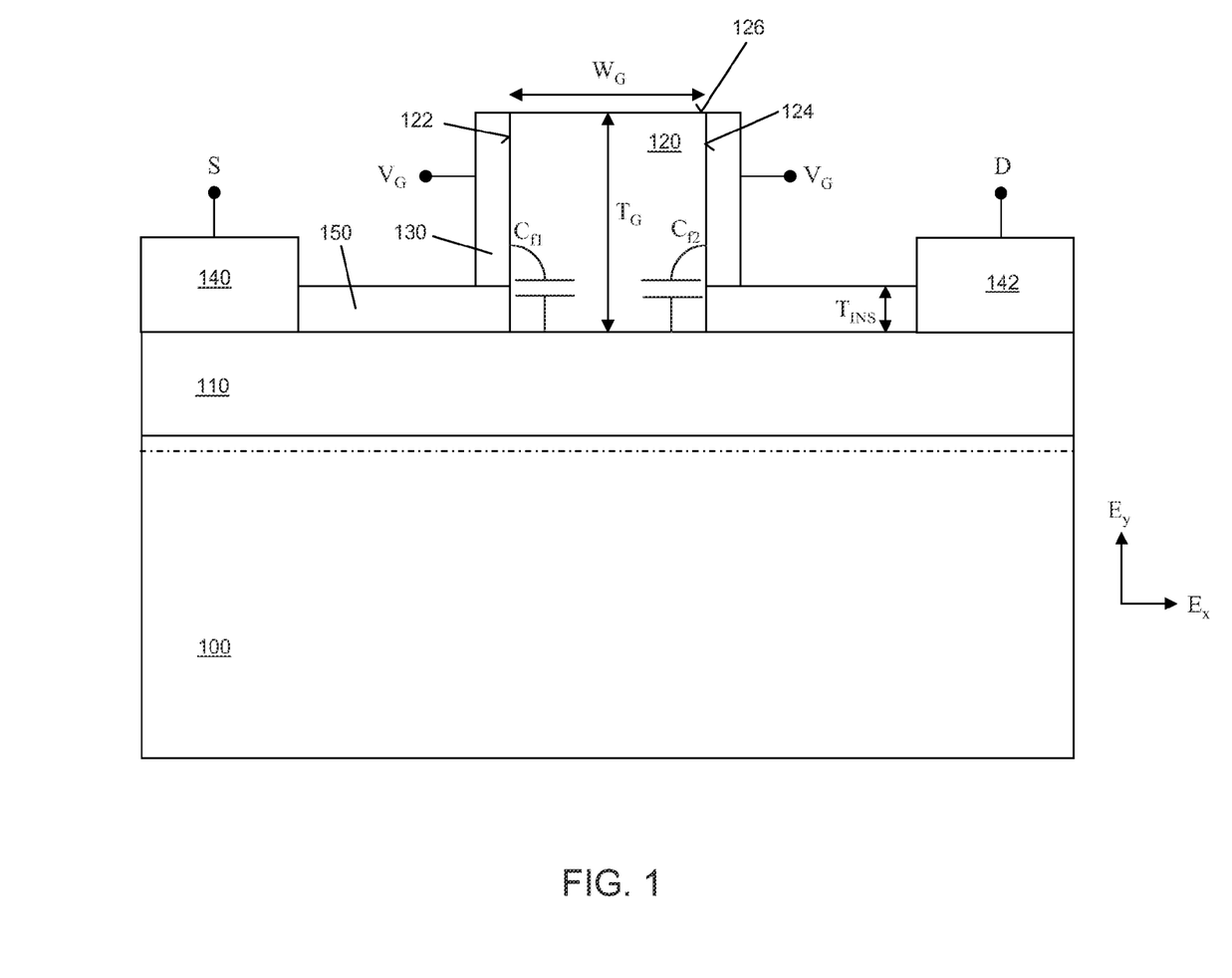
FIG. 1 illustrates a cross-sectional schematic view of a normally-off HEMT according to an embodiment.

FIG. 1 illustrates an embodiment of a normally-off HEMT. The HEMT is considered to be normally-off because the device has a positive threshold voltage. The HEMT includes a buffer region 100 of III-V semiconductor material, a barrier region 110 of III-V semiconductor material on the buffer region 100, a gate region 120 of III-V semiconductor material on the barrier region 110 so that the barrier region 110 is interposed between the buffer region 100 and the gate region 120, and a gate electrode 130 adjacent the gate region 120. The buffer region 100 provides a channel (inversion layer) which electrically connects the source (S) and drain (D) terminals of the HEMT. The source and drain terminals can be electrically contacted at respective electrodes 140, 142. The barrier region 110 has a band gap greater than the band gap of the buffer region 100 and causes a 2-D electron gas (2DEG) in the channel as indicated by the dashed line in FIG. 1. That is, the barrier region 110 supplies charge for a 2DEG in the channel. The gate region 120 adjacent the barrier region 110 is undoped or slightly n or p-doped (unintentionally) as a result of the epitaxy processing involved. That is, the epitaxy processing results in active dopant atoms being present in the gate region 120 which is not purposely doped in a deliberate step or steps. Whether the gate region is undoped or doped, the gate region 120 is thick enough to deplete the 2DEG in the channel so that the HEMT has a positive threshold voltage and thus is considered to be normally-off. By choosing the thickness of the gate region 120 so that the 2DEG in the channel is depleted, the gate region 120 need not be doped p-type for depletion purposes.

The total electric field of the HEMT is decoupled or separated into a vertical component (Ey) and a horizontal component (Ex). The vertical and horizontal components of the electric field can be used independently to turn the HEMT on and off. Providing a relatively thick undoped or slightly n or p-doped gate region 120 ensures the HEMT is normally-off without requiring p-type doping of this region. Also, the range of tunability of the threshold voltage of the HEMT can be extended to more positive values. Furthermore, undesirable gate leakage is significantly reduced by eliminating the p-n junction below the gate electrode and by replacing it with a Schottky gate with a very high effective barrier height. This in turn allows a maximum gate voltage in excess of 15V without having any substantial gate leakage. Also, increased transconductance is realized as a result of the improved control exerted by the gate electrode 130 over the channel.

In one embodiment, the buffer region 100 and the gate region 120 each comprise undoped or slightly (unintentionally) n or p-doped GaN and the barrier region 110 comprises AlGaN. The AlGaN barrier region 110 can include a plurality of layers of AlGaN with different Al concentrations. In addition or alternatively, the GaN buffer region 100 can include Al. The concentration of Al in the GaN buffer region 100 is lower than the concentration of Al throughout the AlGaN barrier region 110. In another embodiment, the barrier region 110 comprises a material which is latticed matched to GaN e.g. such as InAlN.

In one embodiment, the gate region 120 is an undoped or slightly n or p-doped GaN layer having a thickness ($T_G$) of about 150 nm to 200 nm or greater. This relatively thick GaN gate layer 120 generates a vertical field ($E_y$) which depletes the 2DEG in the channel below the gate, realizing a normally-off device. The GaN gate layer 120 pull ups the conduction band and therefore depletes the channel. As such, the thickness of the GaN gate layer 120 can be tuned so that the HEMT has a controllable positive threshold voltage.

In one embodiment, the width ($W_G$) of the GaN gate layer 120 is between about 100 nm to 500 nm. If the width of the GaN gate layer 120 is reduced to the range of a few hundred nanometers, the channel can be controlled via the vertical electric field ($E_y$) and also via the lateral fringe capacitances ($C_{f1}$, $C_{f2}$) as schematically shown in FIG. 1. Accordingly a two-dimensional effect is utilized which adds a degree of freedom in tuning the electrical properties of the HEMT, with respect to conventional p-type GaN approaches. Moreover, the effective Schottky barrier height increases with increasing GaN gate thickness and the range of values disclosed herein permits the application of voltages in excess of 15V to the gate electrode 130 without causing any significant gate leakage. By eliminating the p-n junction between the gate region 120 and the barrier region 110 and by replacing this p-n junction with a Schottky gate having a very high effective barrier, undesirable gate leakage is significantly reduced. The gate leakage is suppressed by extending the effective Schottky barrier height. The gate leakage current for the HEMT can be reduced to several orders of magnitudes lower than the drain current, even at high gate voltages e.g. of 6V or greater.

The gate electrode 130 of the normally-off HEMT is spaced apart from the barrier region 110 by an insulating material 150. The insulating material 150 prevents the gate electrode 130 from contacting the barrier region 110, preventing the Schottky barrier from being opened which would result in a lower maximum gate voltage. In one embodiment, the insulating material 150 is a nitride layer having a thickness ($T_{INS}$) between about 30 nm and 80 nm.

Figure 2:
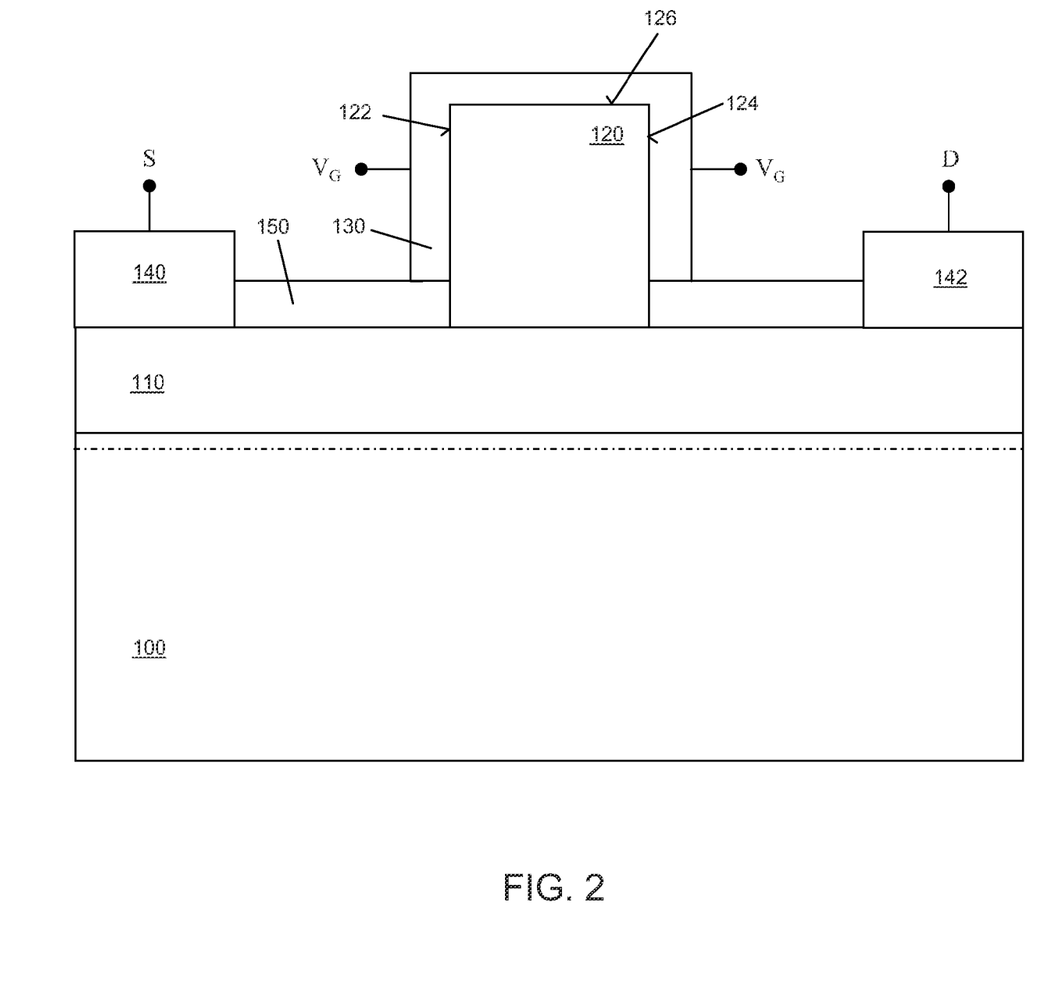
FIG. 2 illustrates a cross-sectional schematic view of a normally-off HEMT according to an embodiment.
Figure 3:
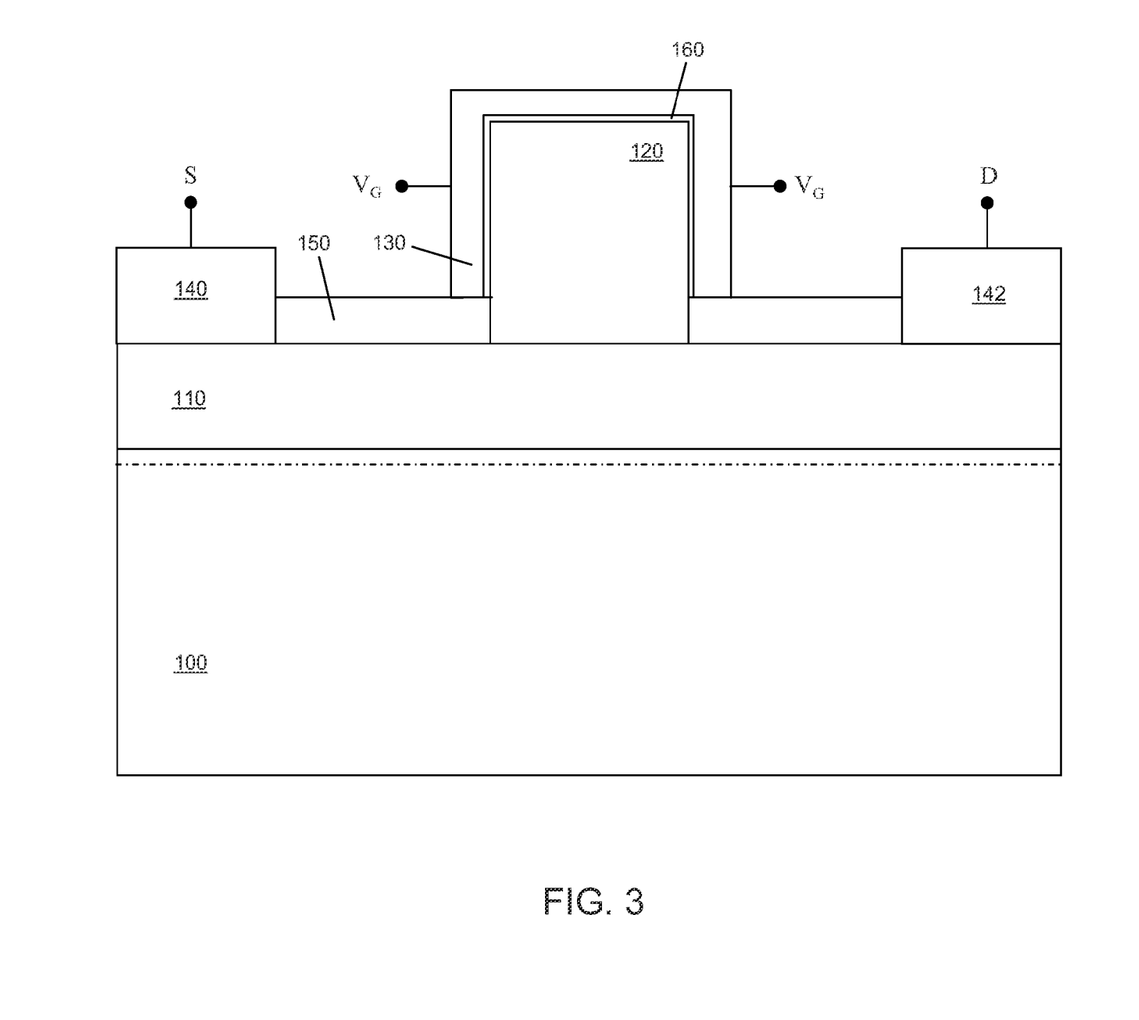
FIG. 3 illustrates a cross-sectional schematic view of a normally-off HEMT according to an embodiment.

The gate electrode 130 is also disposed along at least one of the sidewalls 122, 124 of the gate region 120 as shown in FIG. 1. More precise control of the device electrical characteristics can be realized by disposing the gate electrode 130 only on the sidewalls 122, 124 of the gate region 120. This configuration provides independent gate biases on the left and right sides of the gate region 120. The gate electrode 130 may also cover the top side 126 of the gate region 120 as shown in FIG. 2. In yet another embodiment, the gate electrode 130 is spaced apart from the gate region 120 by a gate dielectric layer 160 as shown in FIG. 3.

Figure 4:
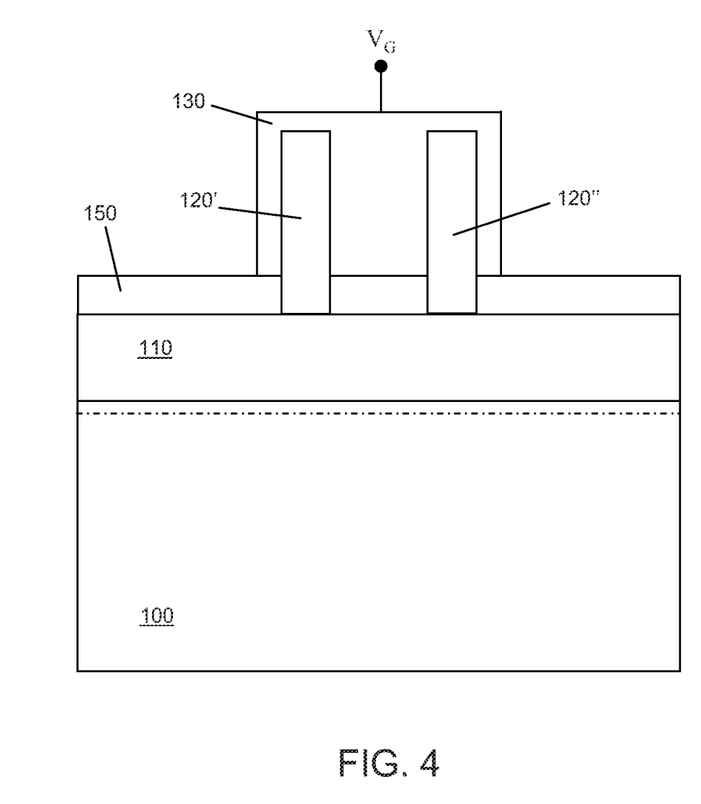
FIG. 4 illustrates a cross-sectional schematic view of a normally-off HEMT according to an embodiment.

FIG. 4 illustrates another embodiment of the normally-off HEMT. According to this embodiment, the gate region 120 of the HEMT is formed by two different sections 120', 120" which are laterally spaced apart from one another by the gate electrode 130. By separating the gate region into two different pillars or fins 120', 120" in this way, short channel effects have less of an adverse influence on the behaviour of the HEMT. For example, DIBL (drain-induced barrier lowering) can be significantly reduced without substantially affecting the current drive capability of the HEMT. The source and drain electrodes are out of view in FIG. 4.

Figure 5:
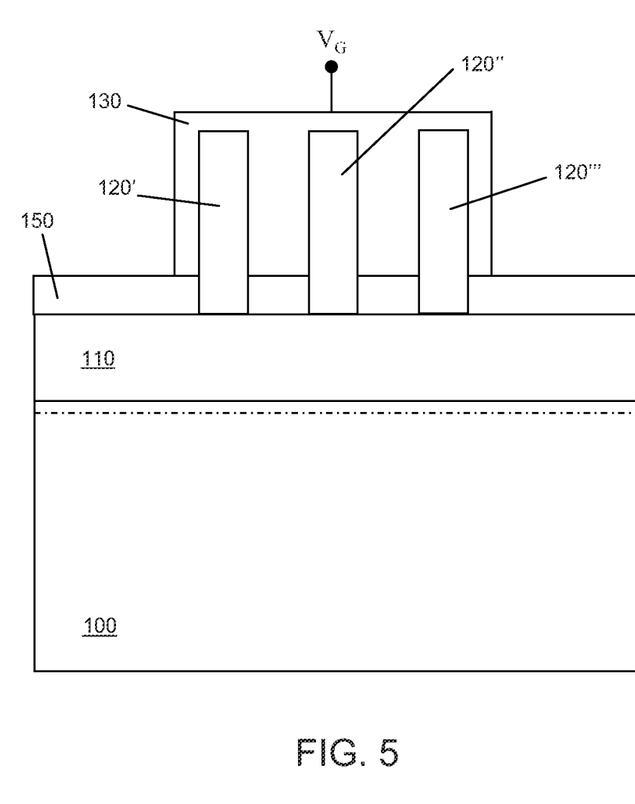
FIG. 5 illustrates a cross-sectional schematic view of a normally-off HEMT according to an embodiment.

FIG. 5 illustrates the normally-off HEMT with the gate region 120 separated into three different sections 120', 120", 120''' which are laterally spaced apart from one another by the gate electrode 130. In general, the gate region 120 can be separated or divided into any desirable number of laterally spaced-apart sections. The source and drain electrodes are out of view in FIG. 5.

Figure 6:
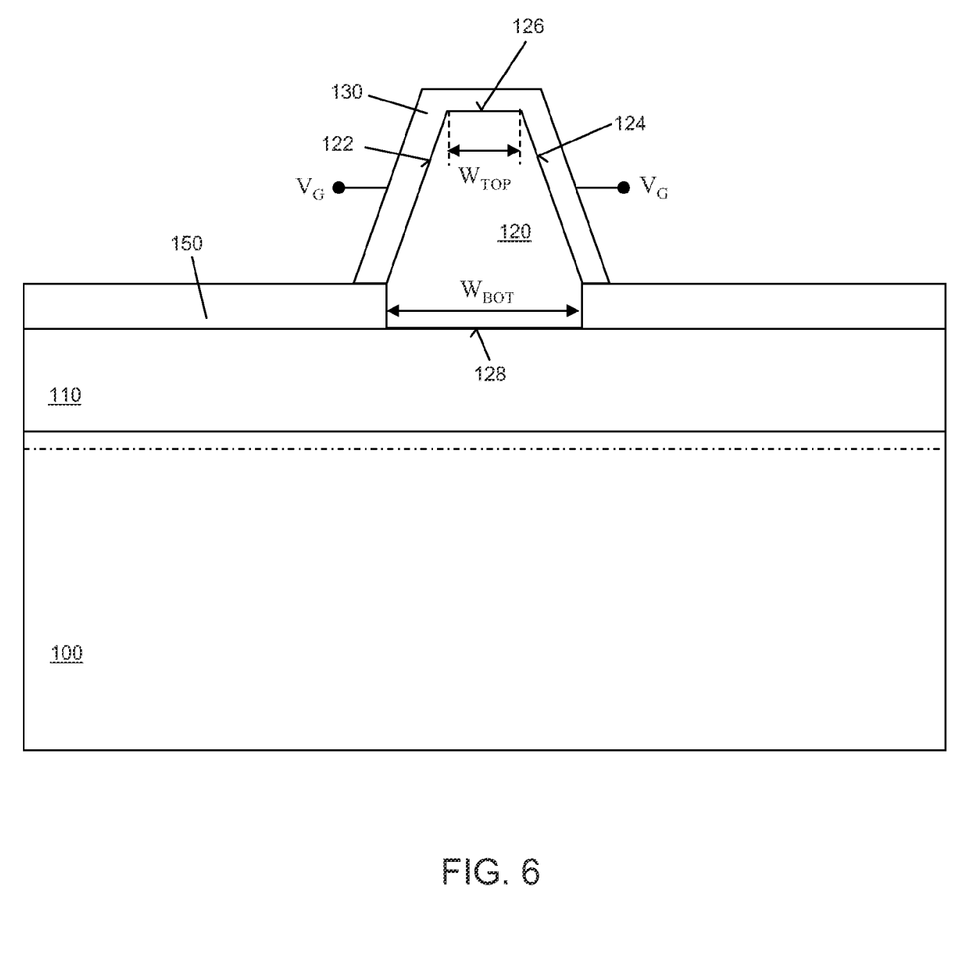
FIG. 6 illustrates a cross-sectional schematic view of a normally-off HEMT according to an embodiment.

FIG. 6 illustrates yet another embodiment of the normally-off HEMT. According to this embodiment, the gate region 120 has tapered sidewalls 122, 124. Particularly, the width ($W_{TOP}$) of the side 126 of the gate region 120 facing away from the barrier region 110 is less than the width ($W_{BOT}$) of the bottom side 128 of the gate region 120 adjoining the barrier region 110. In one embodiment, $W_{BOT}$ is at least 4× greater than $W_{TOP}$. The source and drain electrodes are out of view in FIG. 6.

The normally-off HEMT described herein can be manufactured by forming a first region of III-V semiconductor material such as GaN. The first region forms the buffer region which includes the channel of the HEMT. The first region can be formed via any suitable conventional technique e.g. via heteroepitaxy on a compatible substrate such as silicon, sapphire or SiC or by forming the first region on AlN, Si or on Lithium Gallate or other complex oxide. For severely lattice-mismatched substrates, a nucleation layer such as GaN or AlN can be provided on which the first (buffer) region is formed. A second region of III-V semiconductor material such as AlGaN or InAlN is then formed on the first (buffer) region via any suitable conventional technique e.g. via epitaxy. The second region forms the barrier region of the HEMT which supplies charge for the 2DEG in the channel and serves as a Schottky-gate barrier. The second (barrier) region has a band gap greater than the band gap of the first (buffer) region.

A third region of III-V semiconductor material is then formed on the second (barrier) region via any suitable conventional technique e.g. via epitaxy so that the second (barrier) region is interposed between the first (buffer) region and the third (gate) region. The third (gate) region has a thickness sufficient to deplete the 2DEG in the channel formed in the first (buffer) region so that the HEMT has a positive threshold voltage. A gate electrode is then formed adjacent at least one sidewall of the third (gate) region. The gate electrode can be disposed on one or more of the sidewalls and/or the tope side of the third (gate) region.

Figure 7A:
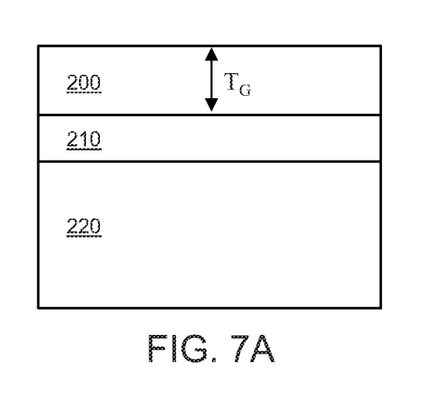
FIGS. 7A-7F illustrate cross-sectional schematic views of a semiconductor structure at various processing steps during manufacture of a normally-off HEMT according to an embodiment.
Figure 7B:
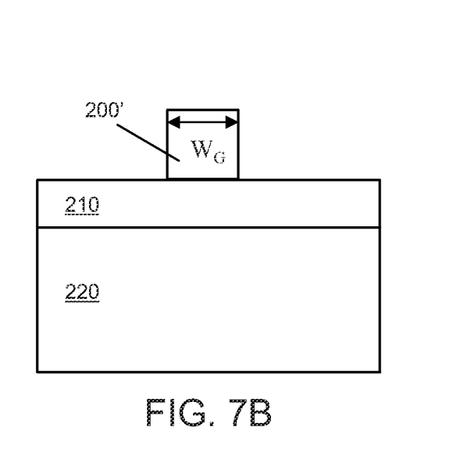

FIGS. 7A-7F illustrate one embodiment of manufacturing the normally-off HEMT. According to this embodiment, a third (gate) region is formed by growing an (unpatterned) epitaxial layer 200 of GaN on a barrier region 210 such as AlGaN as shown in FIG. 7A. The barrier region 210 is disposed on a buffer region 220 such as GaN. The GaN epitaxial layer 200 may have a thickness ($T_G$) of about 150 nm to 200 nm. The epitaxial layer of GaN 200 is the etched e.g. via a conventional lithography process to form the gate region 200' of the HEMT as shown in FIG. 7B. The GaN gate region may have a width ($W_G$) of about 200 nm to 500 nm.

Figure 7C:
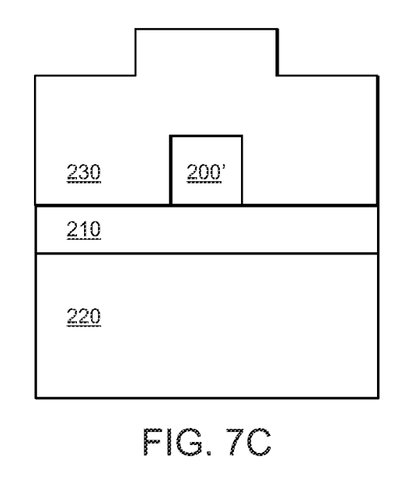
Figure 7D:
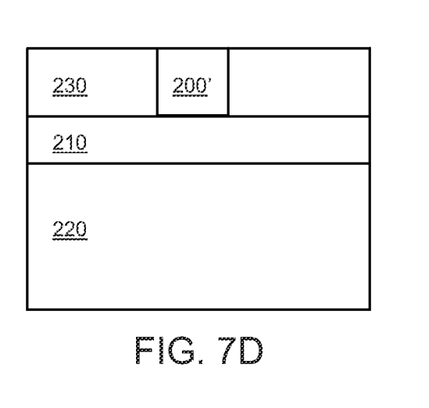
Figure 7E:
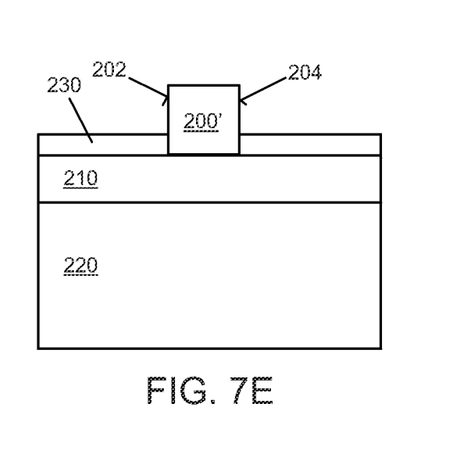
Figure 7F:
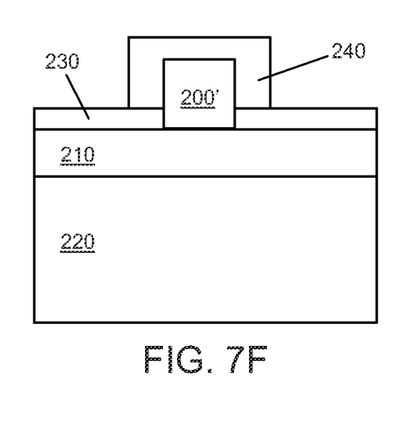

A passivation layer 230 such as nitride is deposited on the gate region 200' and barrier region 210 after the epitaxial layer of GaN 200 is etched. This way, the gate region 200' and the barrier region 110 are both covered by the passivation layer 230 as shown in FIG. 7C. The passivation layer 230 is then planarized e.g. via CMP (chemical-mechanical polishing), stopping after the top of the gate region 200' is exposed as shown in FIG. 7D. The passivation layer 230 is then etched to partly expose each sidewall 202, 204 of the gate region 200' as shown in FIG. 7E. The thickness of the remaining insulating material 230 affects the positive threshold voltage of the HEMT (via the fringe capacitance $C_{f1}$, $C_{f2}$), so precise control of the etch back process is desirable. A timed etch process can be used, or alternatively (in situ) optical layer thickness measuring can be performed during etching to determine when the etch process should be stopped. In either case, the upper part of the gate region sidewalls 202, 204 are exposed. A conductive material 240 such as metal is the deposited adjacent the exposed sidewalls 202, 204 of the gate region 200' (and optionally the top side) to form the gate electrode which is spaced apart from the barrier region 110 by the remaining insulating material 230 as shown in FIG. 7F.

Figure 8A:
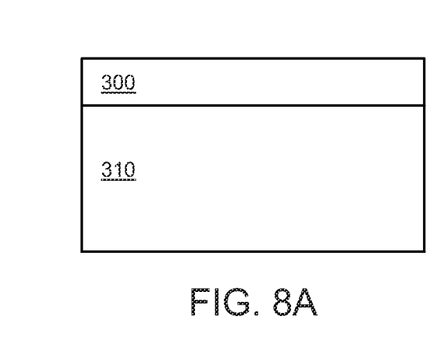
FIGS. 8A-8E illustrate cross-sectional schematic views of a semiconductor structure at various processing steps during manufacture of a normally-off HEMT according to an embodiment.
Figure 8B:
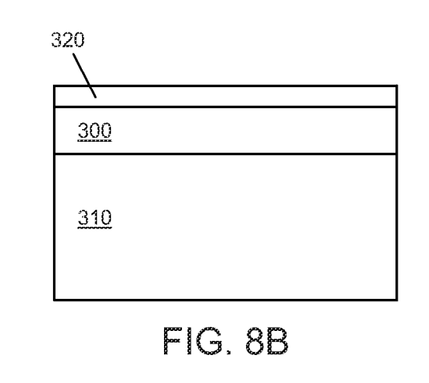
Figure 8C:
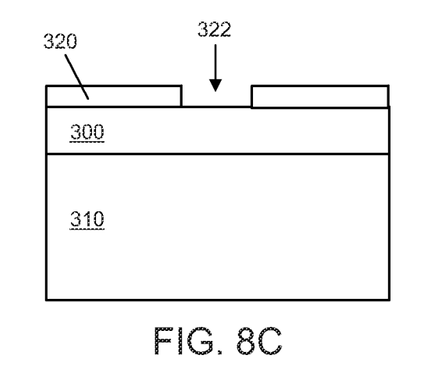
Figure 8D:
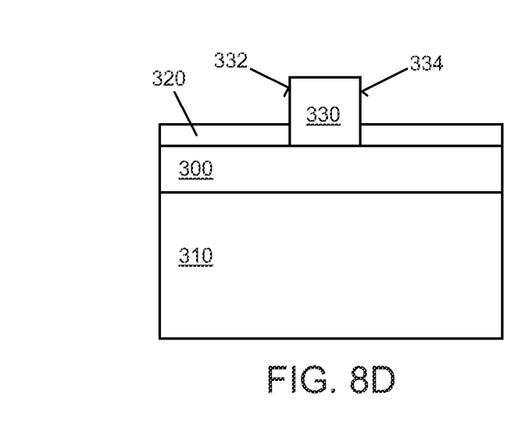
Figure 8E:
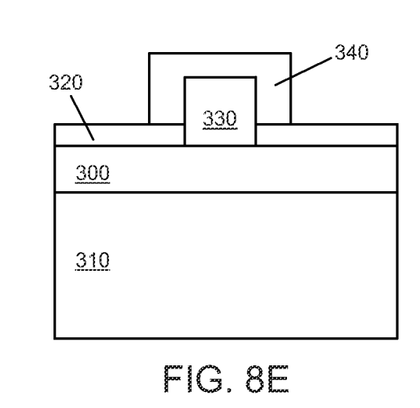

FIGS. 8A-8E illustrate another embodiment of manufacturing the normally-off HEMT. According to this embodiment, an (unpatterned) epitaxial layer of AlGaN 300 is grown on a GaN buffer layer 310 as shown in FIG. 8A. A passivation layer 320 such as nitride is then deposited on the AlGaN barrier layer 300 as shown in FIG. 8B. An opening 322 is etched in the insulating passivation material 320 to expose a section of the AlGaN barrier layer 300 as shown in FIG. 8C. An epitaxial layer of GaN 330 is selectively grown in the opening 322 on the exposed section of AlGaN 300 to form the gate region as shown in FIG. 8D. The gate region 330 has a thickness greater than the thickness of the insulating passivation material 320 so that sidewalls 332, 334 of the gate region 330 are partly exposed. A conductive material 340 such as metal is the deposited adjacent the exposed sidewalls 332, 334 of the gate region 330 (and optionally the top side) to form the gate electrode which is spaced apart from the AlGaN barrier layer 300 by the remaining insulating material 320 as shown in FIG. 8E.

Figure 9A:
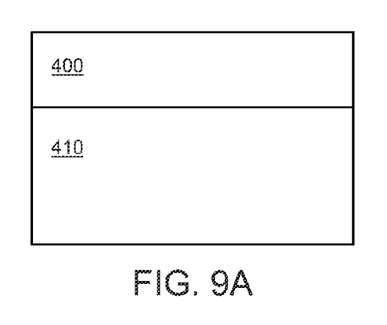
FIGS. 9A-9F illustrate cross-sectional schematic views of a semiconductor structure at various processing steps during manufacture of a normally-off HEMT according to an embodiment.
Figure 9B:
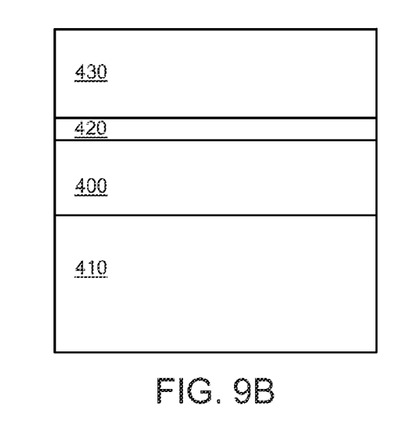
Figure 9C:
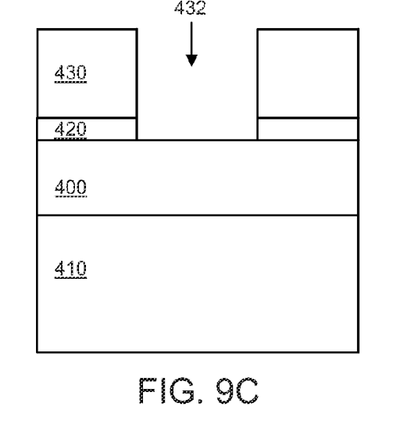
Figure 9D:
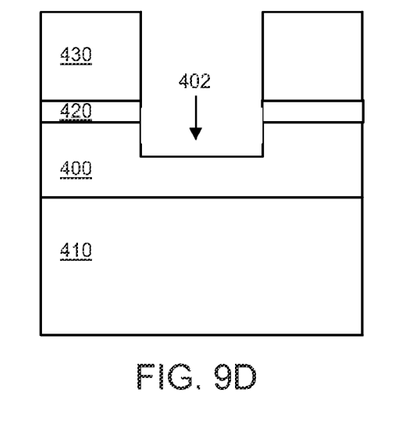
Figure 9E:
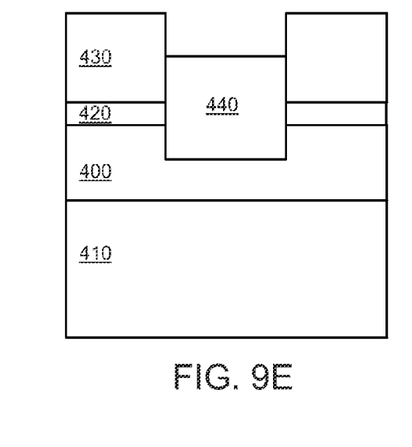
Figure 9F:
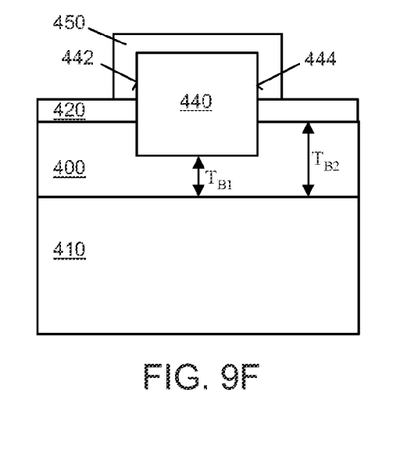

FIGS. 9A-9F illustrate yet another embodiment of manufacturing the normally-off HEMT. According to this embodiment, the barrier region is formed by growing an (unpatterned) epitaxial layer of AlGaN 400 on a GaN buffer layer 410 as shown in FIG. 9A. A nitride layer 420 is then deposited on the AlGaN barrier layer 400 and an oxide layer 430 is deposited on the nitride layer 420 as shown in FIG. 9B. An opening 432 is etched through the oxide layer 430 and the nitride layer 420 to expose an upper section of the AlGaN barrier layer 400 as shown in FIG. 9C. A recess 402 is then formed in the exposed section of the AlGaN barrier layer 400 by etching the AlGaN layer 400 as shown in FIG. 9D. Accordingly, the AlGaN barrier layer 400 has a first thickness ($T_{B1}$) in a middle region and a second thickness ($T_{B2}$) elsewhere where $T_{B2} > T_{B1}$. An epitaxial layer of GaN 440 is then selectively grown in the opening 432 on the recessed section of the AlGaN barrier layer 400 to form the gate region as shown in FIG. 9E. The oxide layer 430 is removed and a conductive material 450 such as metal is deposited adjacent the exposed sidewalls 442, 444 of the gate region 440 (and optionally the top side) to form the gate electrode which is spaced apart from the AlGaN barrier layer 400 by the remaining nitride layer 420 as shown in FIG. 9F. In each of the manufacturing embodiments described above, a gate dielectric covering the gate region can be formed before the gate electrode is formed e.g. as shown in FIG. 3.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A normally-off transistor, comprising:
   a first region of III-V semiconductor material which provides a channel of the transistor;
   a second region of III-V semiconductor material on the first region, the second region having a band gap greater than the band gap of the first region and causing a 2-D electron gas (2DEG) in the channel;
   a third region of III-V semiconductor material on the second region so that the second region is interposed between the first region and the third region, the third region providing a gate of the transistor and having a thickness sufficient to deplete the 2DEG in the channel so that the transistor has a positive threshold voltage; and
   a gate electrode adjacent at least one sidewall of the third region.

2. The normally-off transistor according to claim 1, wherein the gate electrode is spaced apart from the second region by an insulating material.

3. The normally-off transistor according to claim 2, wherein the insulating material comprises SiN and has a thickness between 30 nm and 80 nm.

4. The normally-off transistor according to claim 1, wherein the third region is undoped.

5. The normally-off transistor according to claim 1, wherein the third region is at least 150 nm thick.

6. The normally-off transistor according to claim 1, wherein the gate electrode is disposed on opposing sidewalls of the third region and a side of the third region facing away from the second region.

7. The normally-off transistor according to claim 1, wherein the second region comprises AlGaN or InAlN.

8. The normally-off transistor according to claim 1, wherein the transistor is devoid of a p-n junction at an interface between the second and third regions.

9. The normally-off transistor according to claim 1, wherein the transistor is operable to withstand a gate voltage of at least 10V applied to the gate electrode.

10. The normally-off transistor according to claim 1, wherein the third region has a width between 100 nm and 500 nm.

11. The normally-off transistor according to claim 1, wherein the third region is separated in a plurality of sections which are laterally spaced apart from one another by the gate electrode.

12. The normally-off transistor according to claim 1, wherein the third region has tapered sidewalls.

13. The normally-off transistor according to claim 12, wherein a side of the third region adjacent the second region is at least 4× wider than an opposing side of the third region facing away from the second region.

14. The normally-off transistor according to claim 1, wherein the gate electrode is spaced apart from the third region by a gate dielectric.

15. A normally-off transistor, comprising:
    a buffer region of III-V semiconductor material;
    a barrier region of III-V semiconductor material on the buffer region, the barrier region having a band gap greater than the band gap of the buffer region;
    a gate region of III-V semiconductor material on the barrier region so that the barrier region is interposed between the buffer region and the gate region, the gate region being undoped or n-doped and thick enough to deplete a 2-D electron gas in the buffer region so that the transistor has a positive threshold voltage; and
    a gate electrode adjacent the gate region.

16. The normally-off transistor according to claim 15, wherein the barrier region is thinner directly under the gate region and thicker elsewhere.

17. A normally-off transistor, comprising:
    a first GaN layer;
    an AlGaN layer on the first GaN layer;
    a second GaN layer on the AlGaN layer so that the AlGaN layer is interposed between the first and second GaN layers, the second GaN layer being undoped or n-doped and at least 150 nm thick; and
    a gate electrode adjacent the second GaN layer.

18. The normally-off transistor according to claim 17, wherein the AlGaN layer comprises a plurality of layers of AlGaN with different Al concentrations.

19. The normally-off transistor according to claim 17, wherein the first GaN layer comprises Al and the concentration of Al in the first GaN layer is lower than the concentration of Al throughout the AlGaN layer.

20. A method of manufacturing a normally-off transistor, comprising:
    forming a first region of III-V semiconductor material;
    forming a second region of III-V semiconductor material on the first region, the second region having a band gap greater than the band gap of the first region;
    forming a third region of III-V semiconductor material on the second region so that the second region is interposed between the first region and the third region, the third region having a thickness sufficient to deplete a 2-D electron gas (2DEG) in the first region so that the transistor has a positive threshold voltage; and
    forming a gate electrode adjacent at least one sidewall of the third region.

21. The method according to claim 20, wherein forming the third region comprises etching an epitaxial layer of GaN grown on the second region.

22. The method according to claim 21, further comprising:
    depositing an insulating material after the epitaxial layer of GaN is etched to form the third region so that the second and third regions are covered by the insulating material;
    etching the insulating material to partly expose each sidewall of the third region; and
    depositing a conductive material adjacent the exposed sidewalls of the third region to form the gate electrode which is spaced apart from the second region by the remaining insulating material.

23. The method according to claim 20, wherein forming the third region comprises:
    depositing an insulating material on the second region;
    etching an opening in the insulating material to expose a section of the second region;

selectively growing an epitaxial layer of GaN in the opening on the exposed section of the second region to form the third region, the third region having a thickness greater than the thickness of the insulating material so that sidewalls of the third region are partly exposed; and depositing a conductive material adjacent the exposed sidewalls of the third region to form the gate electrode which is spaced apart from the second region by the insulating material.

24. The method according to claim 20, wherein forming the third region comprises:

depositing a nitride layer on the second region;

depositing an oxide layer on the nitride layer;

etching an opening in the nitride layer and the oxide layer to expose a section of the second region;

forming a recess in the exposed section of the second region;

selectively growing an epitaxial layer of GaN in the opening on the recessed section of the second region to form the third region, the third region having a thickness greater than the thickness of the nitride layer so that sidewalls of the third region are partly exposed;

removing the oxide layer; and depositing a conductive material adjacent the exposed sidewalls of the third region to form the gate electrode which is spaced apart from the second region by the nitride layer.

25. The method according to claim 20, further comprising forming a gate dielectric covering the third region before the gate electrode is formed.

26. The method according to claim 20, wherein the third region is doped as a result of epitaxy processing.

\* \* \* \* \*